United States Patent
Cho et al.

(10) Patent No.: US 7,864,619 B2
(45) Date of Patent: Jan. 4, 2011

(54) WRITE DRIVER CIRCUIT FOR PHASE-CHANGE MEMORY, MEMORY INCLUDING THE SAME, AND ASSOCIATED METHODS

(75) Inventors: Beak-hyung Cho, Hwaseong-si (KR); Kwang-ho Kim, Hwaseong-si (KR); Young-pil Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 68 days.

(21) Appl. No.: 12/292,200

(22) Filed: Nov. 13, 2008

(65) Prior Publication Data

US 2009/0122593 A1    May 14, 2009

(30) Foreign Application Priority Data

Nov. 13, 2007    (KR) .................. 10-2007-0115488

(51) Int. Cl.
G11C 8/00     (2006.01)
G11C 5/14     (2006.01)
G11C 11/00    (2006.01)

(52) U.S. Cl. ............... 365/230.06; 365/163; 365/189.09

(58) Field of Classification Search ............. 365/163, 365/230.06
See application file for complete search history.

(56) References Cited

U.S. PATENT DOCUMENTS

| | | | |
|---|---|---|---|
| 6,885,602 B2 * | 4/2005 | Cho et al. | 365/211 |
| 7,012,834 B2 * | 3/2006 | Cho et al. | 365/163 |
| 7,110,286 B2 * | 9/2006 | Choi et al. | 365/163 |
| 7,149,103 B2 | 12/2006 | Ahn | |
| 7,180,771 B2 * | 2/2007 | Cho et al. | 365/163 |
| 7,262,990 B2 * | 8/2007 | Cho et al. | 365/163 |
| 7,274,586 B2 | 9/2007 | Choi et al. | |
| 7,295,464 B2 * | 11/2007 | Cho et al. | 365/163 |
| 7,499,316 B2 * | 3/2009 | Choi et al. | 365/163 |
| 7,502,251 B2 * | 3/2009 | Choi et al. | 365/163 |
| 7,511,993 B2 * | 3/2009 | Choi et al. | 365/163 |
| 2006/0087876 A1 * | 4/2006 | Cho et al. | 365/148 |
| 2006/0274574 A1 | 12/2006 | Choi et al. | |
| 2007/0064473 A1 | 3/2007 | Lee et al. | |
| 2007/0153563 A1 | 7/2007 | Nirschl | |
| 2008/0062753 A1 * | 3/2008 | Cho et al. | 365/163 |

FOREIGN PATENT DOCUMENTS

KR    10-2005-0079030 A    8/2005
KR    10-2007-0032427 A    3/2007

* cited by examiner

*Primary Examiner*—Son L Mai
(74) *Attorney, Agent, or Firm*—Lee & Morse, P.C.

(57) ABSTRACT

A write driver circuit for a memory that includes phase-change memory cells changeable between a RESET state resistance and a SET state resistance in response to an applied current pulse, the write driver circuit including a write current level adjusting unit configured to determine first to n-th SET state current levels in response to a SET state current level signal, where n is an integer greater than 1, and configured to determine a RESET state current level in response to a RESET state current level signal, and a write current output unit configured to generate one of a SET state current pulse and a RESET state current pulse corresponding to a SET state current level or a RESET state current level determined by the write current level adjusting unit.

19 Claims, 9 Drawing Sheets

WRITE DRIVER CIRCUIT FOR PHASE-CHANGE MEMORY, MEMORY INCLUDING THE SAME, AND ASSOCIATED METHODS

BACKGROUND

1. Technical Field

Embodiments relate to a semiconductor memory. More particularly, embodiments relate to a write driver circuit for a phase-change memory and a memory including the same.

2. Description of the Related Art

A Phase-change Random Access Memory (PRAM) is a nonvolatile memory device that stores data using a phase-change material, such as GST (Ge—Sb—Te), having a resistance that changes with a phase transition between amorphous and crystalline states. The phase transition may be controlled by controlling a temperature change and the time over which the phase change material is heated and cooled. The PRAM has characteristics of nonvolatility and low power consumption, as well as the advantages of a Dynamic Random Access Memory (DRAM).

Either the crystalline state or the amorphous state of the phase-change material is selected by a level of current flowing through the phase-change material. High current supplied for a short period of time changes the phase-change material into the amorphous state, which is commonly called a RESET state and corresponds to data "1". A current lower than the RESET current supplied for a long period of time changes the phase-change material into the crystalline state, which is commonly called a SET state and corresponds to data "0".

The phase-change material has a greater resistance in the RESET state than in the SET state. The memory cell changes from the SET state to the RESET state by heating the phase-change material to a melting temperature or higher through RESET current supply and then fast quenching the phase-change material. On the other hand, the memory cell changes from the RESET state to the SET state by heating the phase-change material to a crystallizing temperature or higher through SET current supply for a predetermined time and then quenching the phase-change material.

In a memory array including a plurality of phase-change memory cells, each memory cell may have different parasitic resistance depending on its layout. Also, loads may differ between signal lines connected to the memory cells. Further, there may be variations due to process margins in the manufacturing process. Accordingly, there may be a difference in RESET current between the memory cells.

SUMMARY

Embodiments are therefore directed to a write driver circuit for a phase-change memory and a memory including the same, which substantially overcome one or more of the problems due to the limitations and disadvantages of the related art.

It is therefore a feature of an embodiment to provide a write driver circuit configured to adjust a level of RESET current.

It is therefore another feature of an embodiment to provide a write driver circuit configured to discharge a word line in a period of write operation in which the SET current and the RESET current are not generated.

It is therefore another feature of an embodiment to provide a write driver circuit configured to generate a SET current and a RESET using a boosted voltage.

At least one of the above and other features and advantages may be realized by providing a write driver circuit for a memory that includes phase-change memory cells changeable between a RESET state resistance and a SET state resistance in response to an applied current pulse, the write driver circuit including a write current level adjusting unit configured to determine first to n-th SET state current levels in response to a SET state current level signal, where n is an integer greater than 1, and configured to determine a RESET state current level in response to a RESET state current level signal, and a write current output unit configured to generate one of a SET state current pulse and a RESET state current pulse corresponding to a SET state current level or a RESET state current level determined by the write current level adjusting unit.

The first to n-th SET state current levels may each have a minimum current level above a reference current level, and the first to n-th SET state current levels may be reduced over a duration of a write operation.

The reference current level may maintain the phase-change memory cells at a crystallizing temperature at which a phase-change material in the phase-change memory cells begin to crystallize, the crystallizing temperature being lower than a melting temperature of the phase-change material. The first SET state current level may change a phase-change memory cell requiring a highest current level for the SET state resistance among the phase-change memory cells, into the SET state resistance. The first SET state current level may not exceed a level of current that would heat the phase-change memory cells to their melting temperature.

The write current output unit may include a drive transistor, one terminal of the drive transistor may be connected to a supply voltage, another terminal of the drive transistor may be connected to a word line of the semiconductor memory, and a gate of the drive transistor may receive a second node voltage corresponding to a supply voltage.

The write current level adjusting unit may include a SET state current level adjusting unit enabled by a first control signal for determining first to n-th SET state current levels corresponding to the SET state current level signal, a RESET state current level adjusting unit enabled by a second control signal for determining a RESET state current level corresponding to the RESET state current level signal, and a transfer unit configured to transfer the first to n-th SET state current levels and the RESET state current level to the write current output unit.

The SET state current level adjusting unit may include an 11th transistor turned on by the first control signal, and a 12th transistor having one terminal receiving a second node voltage corresponding to a supply voltage, having another terminal connected to the 11th transistor, and having a gate receiving the SET state current level signal.

The RESET state current level adjusting unit may include a 21st transistor controlled by the second control signal, and a 22nd transistor having one terminal receiving a second node voltage corresponding to a supply voltage, having another terminal connected to the 21st transistor, and having a gate receiving the RESET state current level signal.

The write driver circuit may further include a control unit that includes a first control signal generating unit configured to output the first control signal in response to a SET state current width control signal and a first write data value, and a second control signal generating unit configured to output the second control signal in response to a RESET state current width control signal and a second write data value.

The transfer unit may include a transfer transistor, the transfer transistor may have a gate and one terminal each receiving a second node voltage corresponding to a supply voltage, the transfer transistor may include another terminal receiving the supply voltage, and the terminal of the transfer transistor that receives the second node voltage may be connected to the SET state current level adjusting unit and the RESET state current level adjusting unit.

The write driver circuit may further include a discharge unit configured to discharge a word line of the memory. The discharge unit may receive a third control signal and a busy signal, and the discharge unit may discharge the word line in a write period in which the SET state current pulse and the RESET state current pulse are not generated, in response to the third control signal and the busy signal.

The write driver circuit may further include a control unit configured to output the third control signal in response to a SET state current width control signal, a RESET state current width control signal, and a write data value. The discharge unit may include a NOR unit configured to perform a NOR operation on the third control signal and the busy signal, and a discharge transistor gated by an output of the NOR unit and disposed between a ground voltage and the word line.

The write current output unit may be configured to output the SET state current pulse and the RESET state current pulse using a boosted voltage, the boosted voltage being higher than a supply voltage. The write current output unit may include a drive transistor, the drive transistor may have a terminal connected to the boosted voltage, the drive transistor may have another terminal connected to a word line of the memory, and the drive transistor may have a gate receiving a second node voltage corresponding to the boosted voltage.

The write driver circuit may further include a gate voltage boosting unit configured to boost a gate voltage of the drive transistor. The gate voltage boosting unit may include a boosting transistor disposed between a source of the boosted voltage and the gate of the drive transistor, and a level shifter boosting a third control signal to correspond to the boosted voltage and configured to apply the third control signal to a gate of the boosting transistor, the third control signal being enabled in a write period in which the SET state current pulse and the RESET state current pulse are not generated.

The write current level adjusting unit may determine the first to n-th SET state current levels and the RESET state current level using the boosted voltage. The write current level adjusting unit may include a SET state current level adjusting unit enabled by a first control signal for determining the first to n-th SET state current levels corresponding to the SET state current level signal, a RESET state current level adjusting unit enabled by a second control signal for determining a RESET state current level corresponding to the RESET state current level signal, and a transfer unit configured to transfer the first to n-th SET state current levels and the RESET state current level to the write current output unit.

The transfer unit may include a transfer transistor, the transfer transistor may have a gate and one terminal each receiving a second node voltage corresponding to the boosted voltage, the transfer transistor may have another terminal receiving the boosted voltage, and the terminal of the transfer transistor that receives the second node voltage may be connected to the SET state current level adjusting unit and the RESET state current level adjusting unit. The write driver circuit may further include a gate voltage boosting unit configured to boost a gate voltage of the transfer transistor. The write current level adjusting unit may be configured to adjust a level of the RESET current, and the write current output unit may include a driving transistor that outputs both the SET state current pulse and the RESET state current pulse.

At least one of the above and other features and advantages may also be realized by providing a memory, including a plurality of phase-change memory cells changeable between a RESET state resistance and a SET state resistance in response to an applied current pulse, and the write driver circuit according to an embodiment.

At least one of the above and other features and advantages may also be realized by providing a system, including a processor, a bus coupled to the processor, and a memory coupled to the bus, wherein the memory includes a plurality of phase-change memory cells changeable between a RESET state resistance and a SET state resistance in response to an applied current pulse, and the write driver circuit according to an embodiment.

At least one of the above and other features and advantages may also be realized by providing a method of operating a memory that includes phase-change memory cells changeable between a RESET state resistance and a SET state resistance in response to an applied current pulse, the method including determining first to n-th SET state current levels in response to a SET state current level signal, where n is an integer greater than 1, determining a RESET state current level in response to a RESET state current level signal, and generating one of a SET state current pulse and a RESET state current pulse corresponding to a SET state current level or a RESET state current level.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1A:
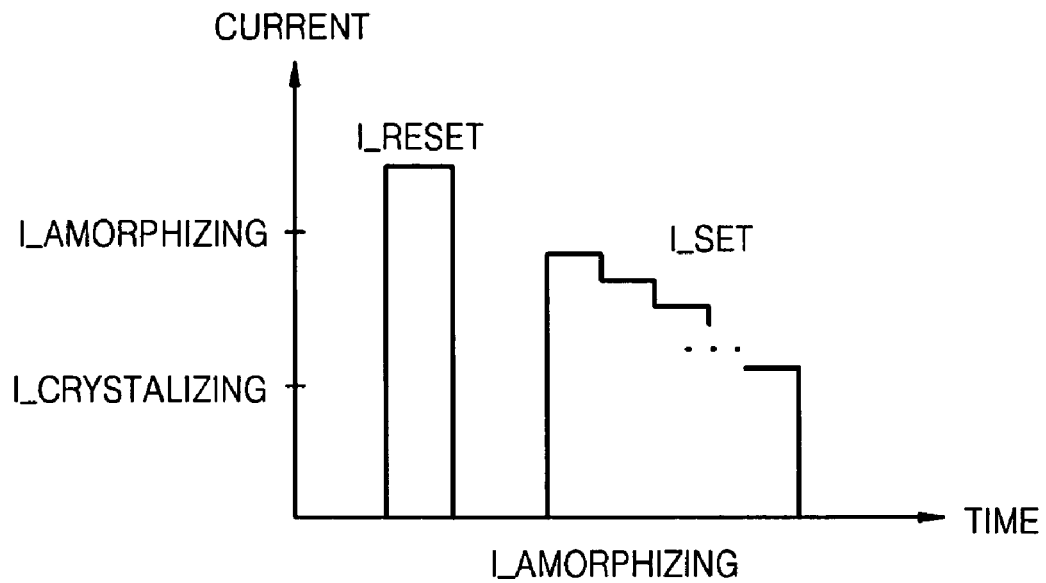
FIGS. 1A, 1B and 1C illustrate examples of SET state current pulses applied to a phase-change memory array according to an embodiment.

Korean Patent Application No. 10-2007-0115488, filed on Nov. 13, 2007, in the Korean Intellectual Property Office, and entitled: "Write Driver Circuit for Phase-Change Memory," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element is referred to as being "between" two other elements, it can be the only element between the two other elements, or one or more intervening elements may also be present. Like reference numerals refer to like elements throughout.

Figure 1B:
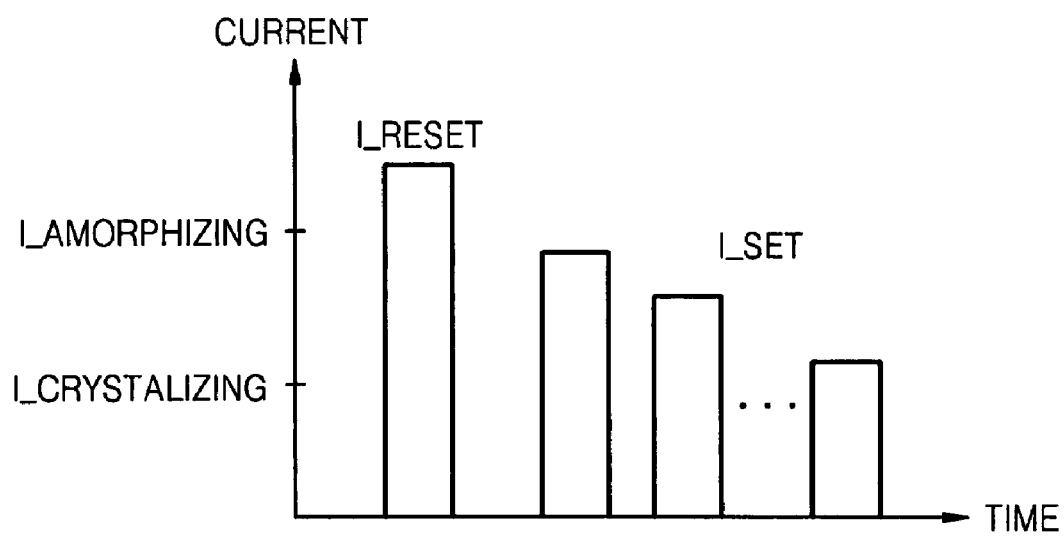
Figure 1C:
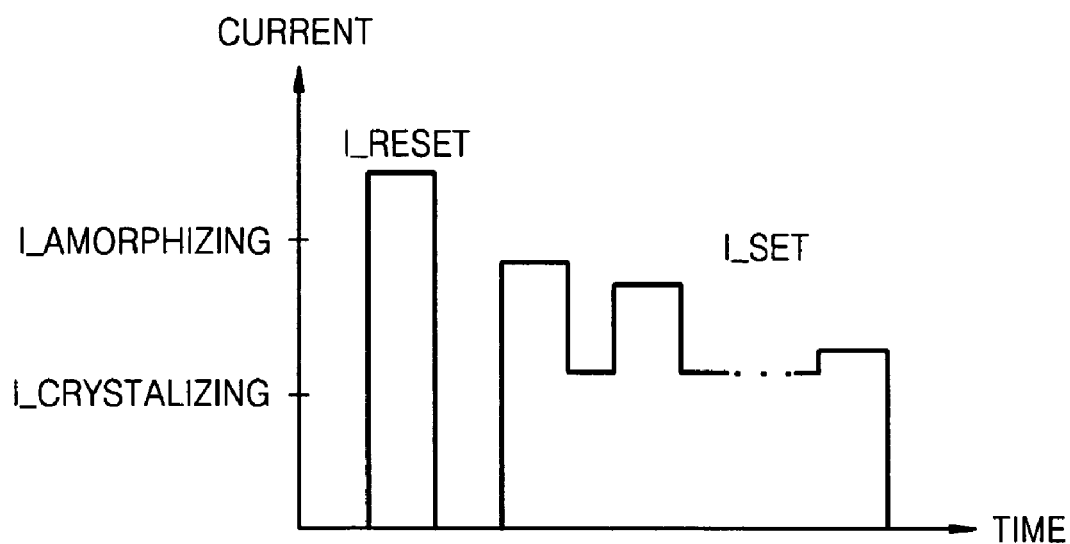
Figure 1D:
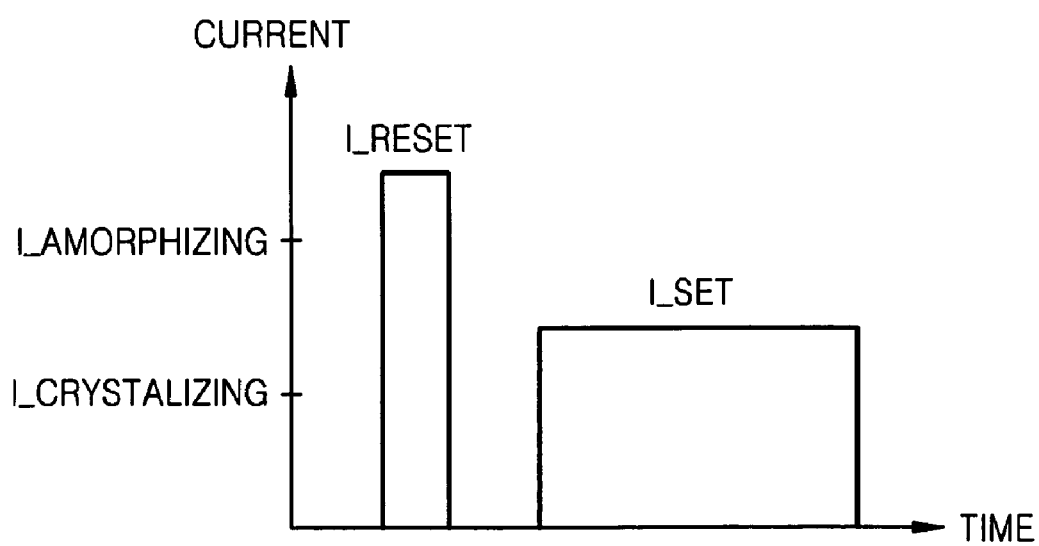
FIG. 1D illustrates a comparative current pulse for writing data to a phase-change material.

FIGS. 1A, 1B and 1C illustrate various waveforms of a SET state current pulse for performing SET programming in situations where variations in SET state current pulses vary between PRAM cells, and FIG. 1D illustrates a comparative current pulse.

In a memory array including a plurality of phase-change memory cells, each memory cell may have different parasitic resistance depending on its layout, which leads to different SET current. Thus, in the memory array including the plurality of phase-change cells, there may be a difference in a current level for transitioning the phase-change cells into the SET state between the memory cells, such that a single level of SET current may not transition all the memory cells into the SET state, i.e., a single SET current may transition only some of the memory cells into the SET state, while others are in the RESET state. This may cause errors during operation of the phase-change memory array. In order to compensate for such parasitic resistance effects, waveforms as shown in FIGS. 1A, 1B and 1C may be implemented to provide a SET state current pulse for performing SET programming in situations where variations in SET state current pulses vary between PRAM cells.

In the comparative current pulse, as shown in FIG. 1D, a short and high current pulse I_RESET may be applied to a phase-change material to melt the same, and the phase-change material may be fast-quenched to become the amorphous state (i.e., the RESET state), or a long and low current pulse I_SET is applied to the phase-change material to heat the same to the crystallizing temperature or higher and make the phase-change material into the crystallization state (i.e., a SET state). Such a waveform, however, does not compensate for the parasitic resistance effects.

Figure 2:
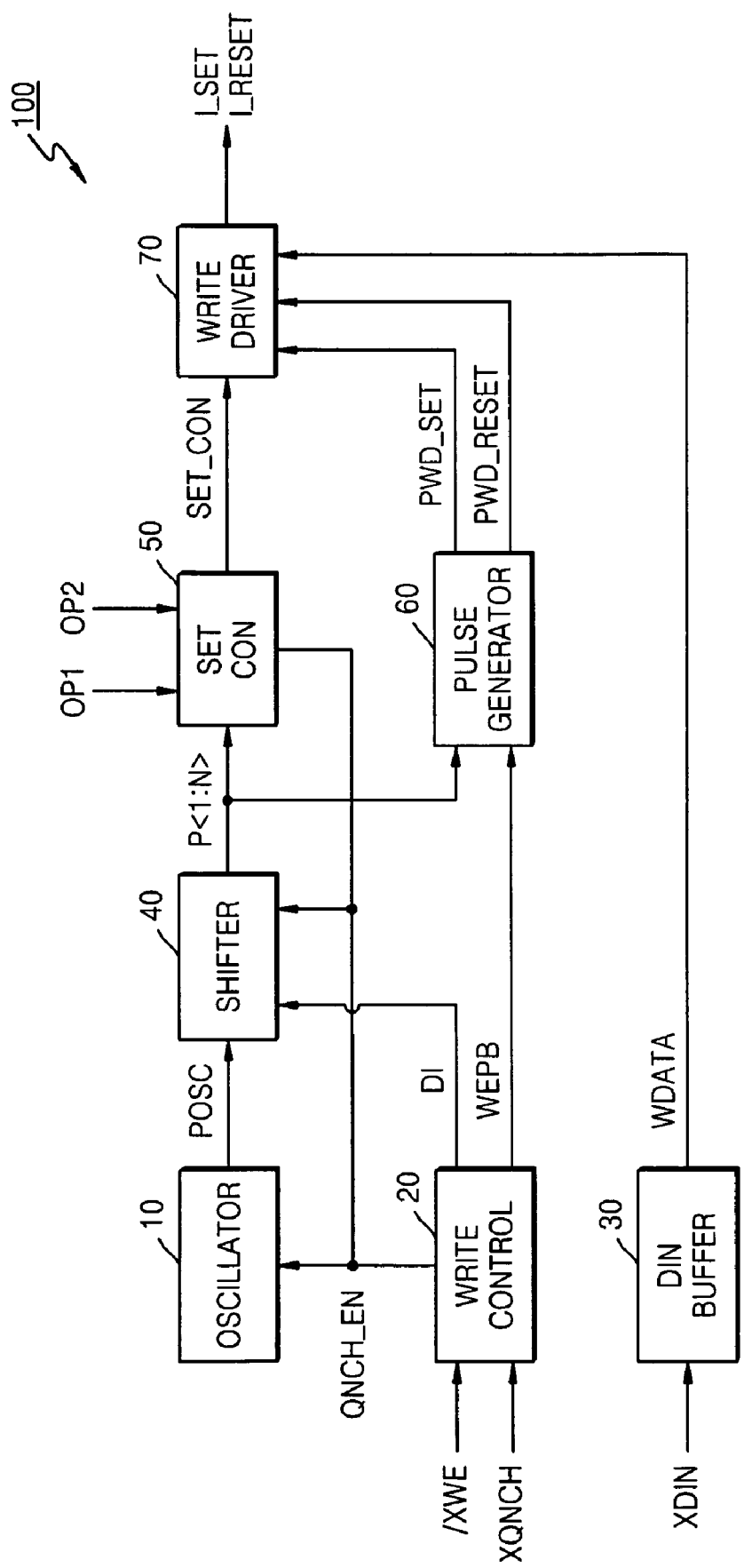
FIG. 2 illustrates a block diagram of a semiconductor memory including a write driver circuit outputting the waveforms shown in FIGS. 1A, 1B and 1C.

FIG. 2 illustrates a block diagram of a semiconductor memory 100 including a write driver circuit outputting the waveforms shown in FIGS. 1A, 1B and 1C.

Referring to FIG. 2, the semiconductor memory 100 may include an oscillator 10, a write control circuit 20, a data input circuit 30, a shifter 40, a SET control circuit 50, a pulse generator 60, and a write driver circuit 70.

The oscillator 10 may be enabled by an operation enable signal QNCH_EN, and may output a clock pulse POSC in response to a pull-up control signal and a pull-down control signal.

The write control circuit 20 may output an operation enable signal QNCH_EN, a shift control signal DI, and a write enable pulse WEPB for enabling the pulse generator 60 in response to a write enable pulse/XWE and an operation signal XQNCH having a constant level.

The data input circuit 30 may receive external data XDIN and may output write data WDATA.

The shifter 40 may receive the clock pulse POSC and the operation enable signal QNCH_EN, and may output first to n-th control pulses P1 to Pn in response to the shift control signal DI. The shift control signal DI may be enabled in synchronization with a first pulse of the clock pulse POSC.

The SET control circuit 50 may output a SET control signal SET_CON in response to the first to n-th control pulses P1 to Pn and the operation enable signal QNCH_EN. The SET control signal SET_CON may correspond to a SET state current level signal DCBL_SET described below.

The pulse generator 60 may output a SET state pulse width control signal PWD_SET and a RESET state pulse width control signal PWD_RESET in response to the first to n-th control pulses P1 to Pn and the write enable pulse WEPB.

The write driver circuit 70 may output a SET state current pulse I_SET or a RESET state current pulse I_RESET in response to the SET state pulse width control signal PWD_SET, the RESET state pulse width control signal PWD_RESET, and the SET control signal SET_CON.

Figure 3:
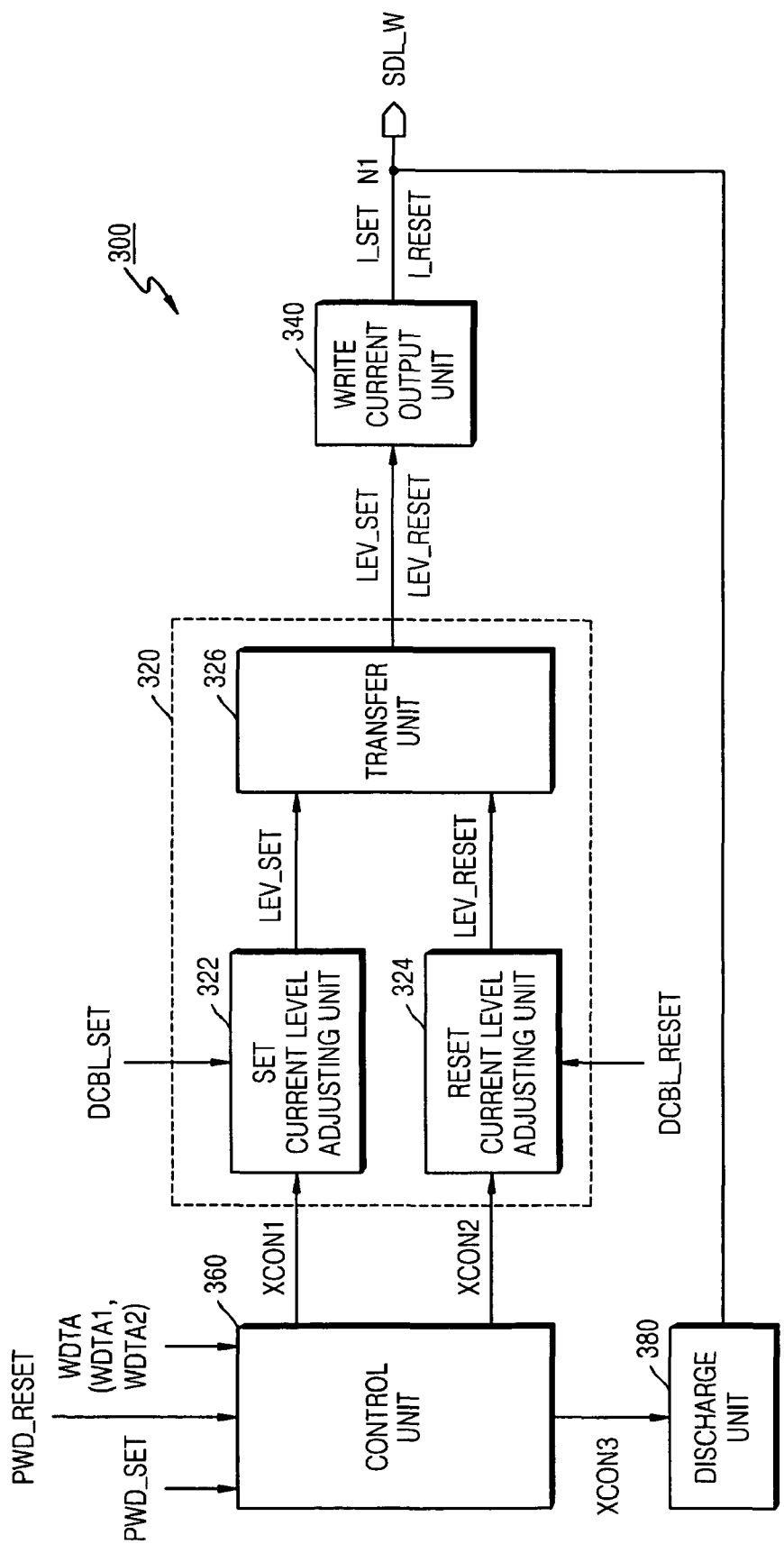
FIG. 3 illustrates a block diagram of a write driver circuit outputting a RESET current that is adjusted according to an embodiment.

FIG. 3 illustrates a block diagram of a write driver circuit 300 outputting a RESET current that is adjusted according to an embodiment. Referring to FIG. 3, a RESET state current level signal DCBL_RESET is provided in the write driver circuit 300, which is configured to adjust a level of a RESET current while reducing a layout area.

The write driver circuit 300 of FIG. 3 may be used as the write driver 70 of FIG. 2. Accordingly, several signals applied for operation of the write driver circuit 300 may be the same as those applied to the write driver 70 of FIG. 2. In FIG. 3, a SET state current level signal DCBL_SET may serve as the SET control signal SET_CON of FIG. 2.

For clarity, a detailed description of signals applied to the write driver circuit 300 that are the same as those described above in connection with FIG. 2 will be not be repeated. Additionally, U.S. Pat. No. 7,262,990 describes subject matter relevant to the structure and function of the embodiments described herein, and is hereby incorporated by reference in its entirety, and for all purposes.

Referring to FIG. 3, the write driver circuit 300 according to an embodiment may include a write current level adjusting unit 320, a write current output unit 340, and a control unit 360. The write driver circuit 300 of FIG. 3 may be included in a semiconductor memory including phase-change memory cells the state of which changes into a RESET resistance state or a SET resistance state in response to an applied current pulse.

The write current level adjusting unit 320 may include a SET current level adjusting unit 322, a RESET current level adjusting unit 324, and a transfer unit 326. The SET current level adjusting unit 322 may be enabled by a first control signal XCON1, and may determine first to n-th SET current levels LEV_SET corresponding to the SET state current level signal DCBL_SET.

The first to n-th SET current levels LEV_SET may each have a minimum current level above a reference current level, and may be gradually reduced. The reference current level may maintain the phase-change memory cells at a crystallizing temperature, i.e., a temperature at which the phase-change memory cells begin to be crystallized. The first SET current level may change a phase-change memory cell necessitating the highest current level for a SET resistance state among the phase-change memory cells, into the SET resistance state. Also, the first SET current level may not exceed a current level for heating phase-change memory cells to their melting temperature. U.S. Pat. No. 7,149,103 describes subject matter relevant to the structure and function of the set programming circuits described herein, and is hereby incorporated by reference in its entirety, and for all purposes.

The RESET current level control unit 324 may be enabled by a second control signal XCON2, and may determine a RESET current level LEV_RESET corresponding to the RESET state current level signal DCBL_RESET. In this case, the first control signal XCON1 and the second control signal XCON2, which enable the SET current level control unit 322 and the RESET current level control unit 324, respectively, may be generated by the control unit 360. The operation of the control unit 360 will be described below in greater detail.

The transfer unit 326 may transfer the first to n-th SET current levels LEV_SET and the RESET current level LEV_RESET to the write current output unit 340.

The write current output unit 340 may generate and output one of a SET state current pulse I_SET and a RESET state current pulse I_RESET in response to the current levels LEV_SET and LEV_RESET from the write current level adjusting unit 320. The SET state current pulse I_SET and the RESET state current pulse I_RESET may be applied to a word line of a semiconductor memory. Although the SET state current pulse I_SET and the RESET state current pulse I_RESET are shown in FIG. 3 as being applied to a sense amplifier data line SDL_W, it may be regarded as application to the word line because the sense amplifier data line SDL_W may be a collection of word lines connected to the same sense amplifier. Accordingly, herein, the sense amplifier data line SDL_W will be regarded as the word line.

Figure 4:
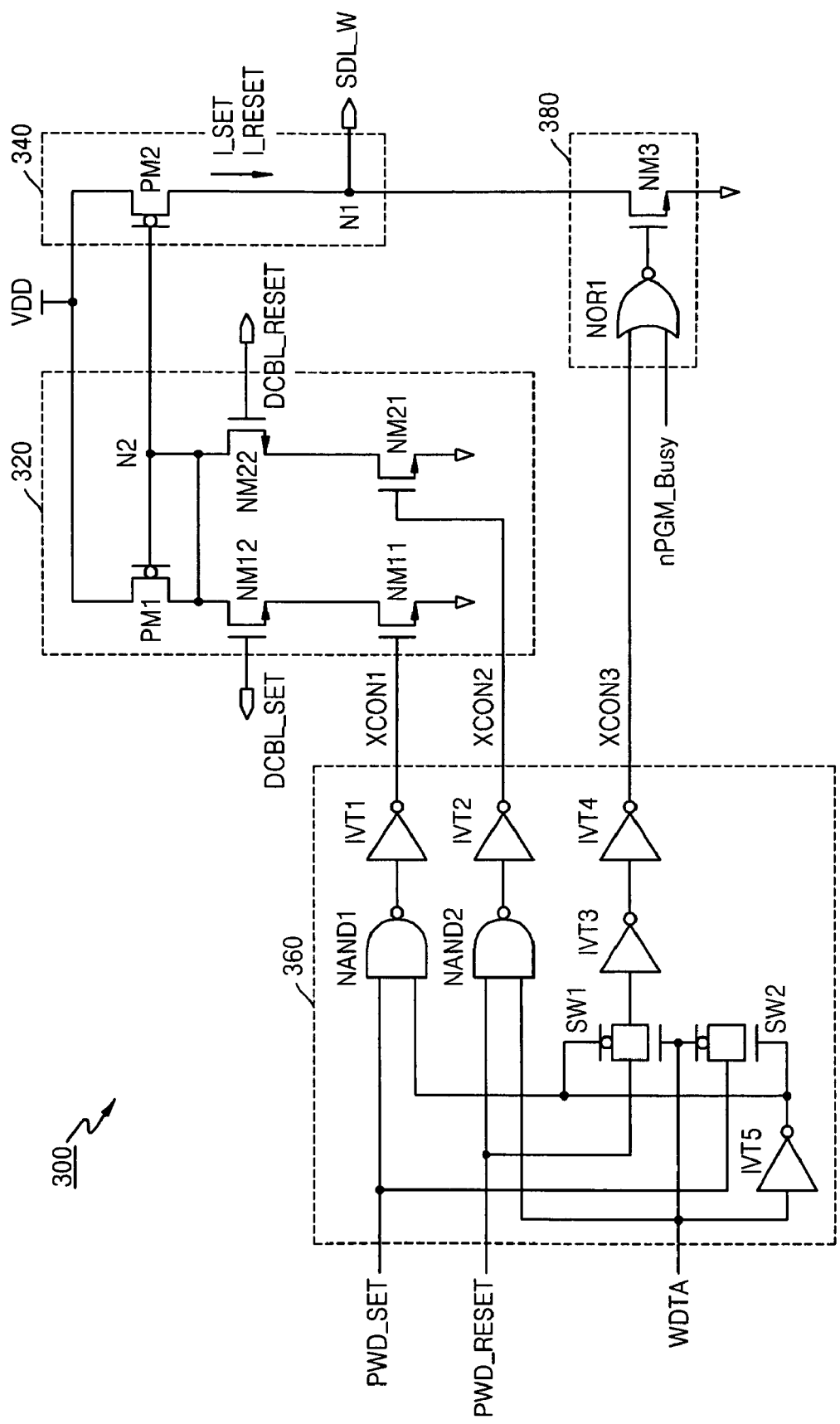
FIG. 4 illustrates a detailed circuit diagram of an example write driver circuit of FIG. 3.

FIG. 4 illustrates a detailed circuit diagram of an example write driver circuit 300 of FIG. 3. Operation of the write driver circuit 300 according to an embodiment will be described in greater detail with reference to FIGS. 3 and 4.

The SET state pulse width control signal PWD_SET, the RESET state pulse width control signal PWD_RESET, and the write data WDTA from the pulse generator 60 and the data input buffer 30 of FIG. 2 may be input to the control unit 360 of the write driver circuit 300.

The control unit 360 may generate a first control signal XCON1 in response to the SET state pulse width control signal PWD_SET and a first write data value WDTA1. In this case, the first write data value WDTA1 may be "0". To change the phase-change memory cell into a SET resistance state, i.e., to write the first write data value WDTA1 of "0", the SET state pulse width control signal PWD_SET may be applied at a logic high "H" level to one terminal of a first NAND unit NAND1. The first write data value WDTA1 may be inverted by a fifth inverter IVT5, and the resultant value "1" may be applied to the other terminal of the first NAND unit NAND1. A first inverter IVT1 may invert a logic low "L" output of the first NAND unit NAND1 to generate the first control signal XCON1 at a logic high "H" level.

The control unit 360 may also generate a second control signal XCON2 in response to the RESET state pulse width control signal PWD_RESET and a second write data value WDTA2. In this case, the second write data value WDTA2 may be "1". To change the phase-change memory cell into a RESET resistance state, i.e., to write the second write data value WDTA2 of "1", the RESET state pulse width control signal PWD_RESET may be applied at a logic high "H" level to one terminal of a second NAND unit NAND2. The second write data value WDTA2 may be applied to the other terminal of the second NAND unit NAND2. A second inverter IVT2 may invert a logic low "L" output of the second NAND unit NAND2 to generate the second control signal XCON2 at a logic high "H" level.

The first control signal XCON1 and the second control signal XCON2 generated as described above may be applied to the SET current level adjusting unit 322 and the RESET current level adjusting unit 324, respectively.

The SET current level adjusting unit 322 may include an 11th transistor NM11 and a 12th transistor NM12. The 11th transistor NM11 may be turned on by a logic high "H" level first control signal XCON1. The 12th transistor NM12 may have one terminal to which a voltage at a second node N2 (corresponding to a supply voltage VDD) is applied. Another terminal of the 12th transistor NM12 may be connected to the 11th transistor NM11, and a gate of the 12th transistor NM12 may receive the SET state current level signal DCBL_SET. In this case, both the 11th transistor NM11 and the 12th transistor NM12 may be NMOS transistors.

The RESET current level adjusting unit 324 may include a 21st transistor NM21 and a 22nd transistor NM22. The 21st transistor NM21 may be turned on by the second control signal XCON2. The 22nd transistor NM22 may have one terminal to which a voltage at a second node N2 (corresponding to the supply voltage VDD) is applied, the other terminal connected to the 21st transistor NM21, and a gate to which the RESET state current level signal DCBL_RESET is applied. Both the 21st transistor NM21 and the 22nd transistor NM22 may be NMOS transistors.

In this structure, during a period in which the SET state current pulse I_SET is required, only the SET current level adjusting unit 322 operates. During a period in which the RESET state current pulse I_RESET is required, only the RESET current level adjusting unit 324 operates.

During a period in which the 11th transistor NM11 is turned on, a current (i.e., one of the first to n-th SET current levels LEV_SET) having a level corresponding to the SET state current level signal DCBL_SET flows through the 12th transistor NM12. Similarly, during a period in which the 21st transistor NM21 is turned on, a current (i.e., the RESET current level LEV_RESET) having a level corresponding to the RESET state current level signal DCBL_RESET flows through the 22nd transistor NM22.

The transfer unit 326 may include a transfer transistor PM1 having a gate and one terminal that both receive the voltage at the second node N2, corresponding to the supply voltage VDD. The transfer transistor PM1 may have another terminal to which the supply voltage VDD is applied. The terminal to which the voltage at the second node N2 is applied may be connected to the SET current level adjusting unit 322 and the RESET current level adjusting unit 324. Accordingly, current flowing through the transfer transistor PM1 may have the same level as current flowing through the 11th transistor NM11 or the 21st transistor NM21.

The write current output unit 340 may also include a driving transistor PM2 having one terminal connected to the supply voltage VDD, the other terminal connected to the word line SDL_W of the semiconductor memory, and a gate to which the voltage at the second node N2 corresponding to the supply voltage VDD is applied.

The transfer transistor PM1 and the driving transistor PM2 may be PMOS transistors having the same size. Current flowing through the transfer transistor PM1 may have the same level as current through the driving transistor PM2. Accordingly, the driving transistor PM2 may generate and output a SET state current pulse I_SET and a RESET state current pulse I_RESET that correspond to the first to n-th SET current level LEV_SET and the RESET current level LEV_RESET, respectively.

In the write driver circuit 300 according to an embodiment, the SET state current pulse and the RESET state current pulse may be generated by the single driving transistor, thus reducing the layout area of the semiconductor memory. Furthermore, the RESET state current pulse corresponding in level to the RESET state current level signal maybe be generated to adjust the RESET current level as well as the SET current level.

In the phase-change memory, current may be supplied to the word line in order to write data corresponding to a state of the phase-change material to a phase-change memory cell, which may affect subsequent write and read operations. For example, where data "1" is to be written to a first phase-change memory cell connected to a first word line, a RESET current may be supplied to the first word line. However, an unintentional voltage may remain on the first word line even after the data "1" has been written to the first cell. Thus, a subsequent write operation for the first cell may become inaccurate, and data for the first cell may be erroneously written or read to other cells. Accordingly, there is a need for a phase-change memory that provides reliable data storage.

A write driver circuit according to an embodiment may include a discharge unit for discharging the word line during a write period in which the SET state current pulse and the RESET state current pulse are not generated. Thus, a write driver according to an embodiment may reliably store date without the need to provide for a separate discharge time. A discharge unit for a write driver circuit according to an embodiment will now be described with reference to FIGS. 3 and 4.

Referring to FIGS. 3 and 4, the write driver circuit 300 according to an embodiment of the present invention may further include a discharge unit 380. The discharge unit 380 may be enabled by a third control signal XCON3 for discharging the word line SDL_W.

The discharge unit 380 may include a NOR unit NOR1 and a discharge transistor NM3. The NOR unit NOR1 may receive the third control signal XCON3 and a busy signal nPGM_Busy, and may output a NOR operation result. The busy signal nPGM_Busy may be logic low "L" in a write period. The third control signal XCON3 may be logic low "L" when both the SET state pulse width control signal PWD_SET and the RESET state pulse width control signal PWD_RESET are not enabled. Thus, the discharge unit 380 may discharge the word line SDL_W when the SET state current pulse I_SET and the RESET state current pulse I_RESET are not generated.

The third control signal XCON3 may be generated by the control unit 360. The control unit 360 may generate the third control signal XCON3 in response to the SET state pulse width control signal PWD_SET, the RESET state pulse width control signal PWD_RESET, and the write data WDTA.

The discharge transistor NM3 may be gated by an output of the NOR unit NOR1, and may be disposed to control a connection between a first node N1 (connected to the word line SDL_W) and a ground voltage. The discharge transistor NM3 may be an NMOS transistor.

The write driver circuit 300 illustrated in FIGS. 3 and 4 is coupled to the supply voltage VDD, but it is not limited to the use of the supply voltage VDD. For example, as described below, the supply voltage may be replaced with a boosted voltage, i.e., a voltage greater than VDD, in order to shorten a time to generate the SET state current pulse and the RESET state current pulse.

Figure 5:
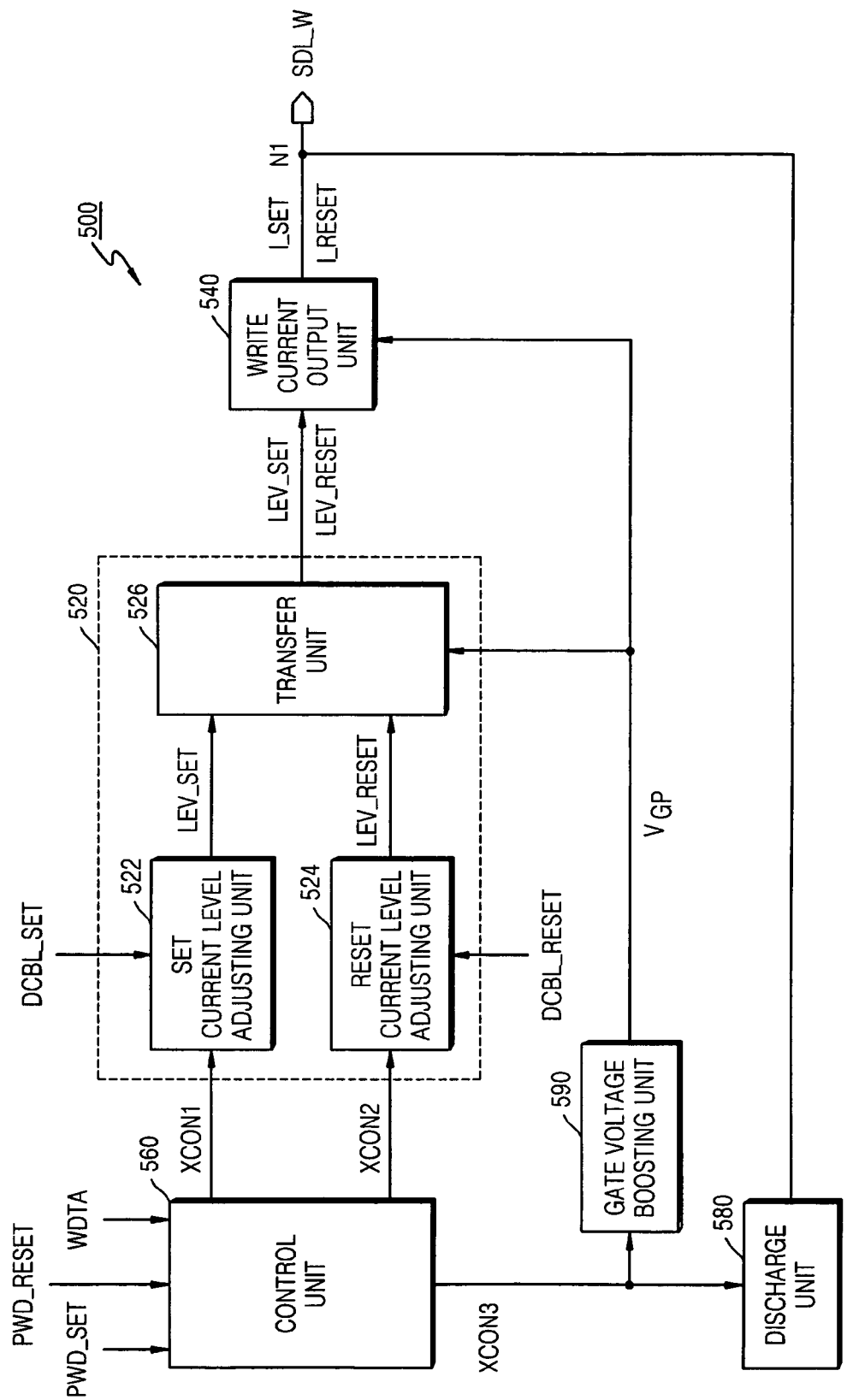
FIG. 5 illustrates a block diagram of a write driver circuit outputting a RESET current that is adjusted according to another embodiment.
Figure 6:
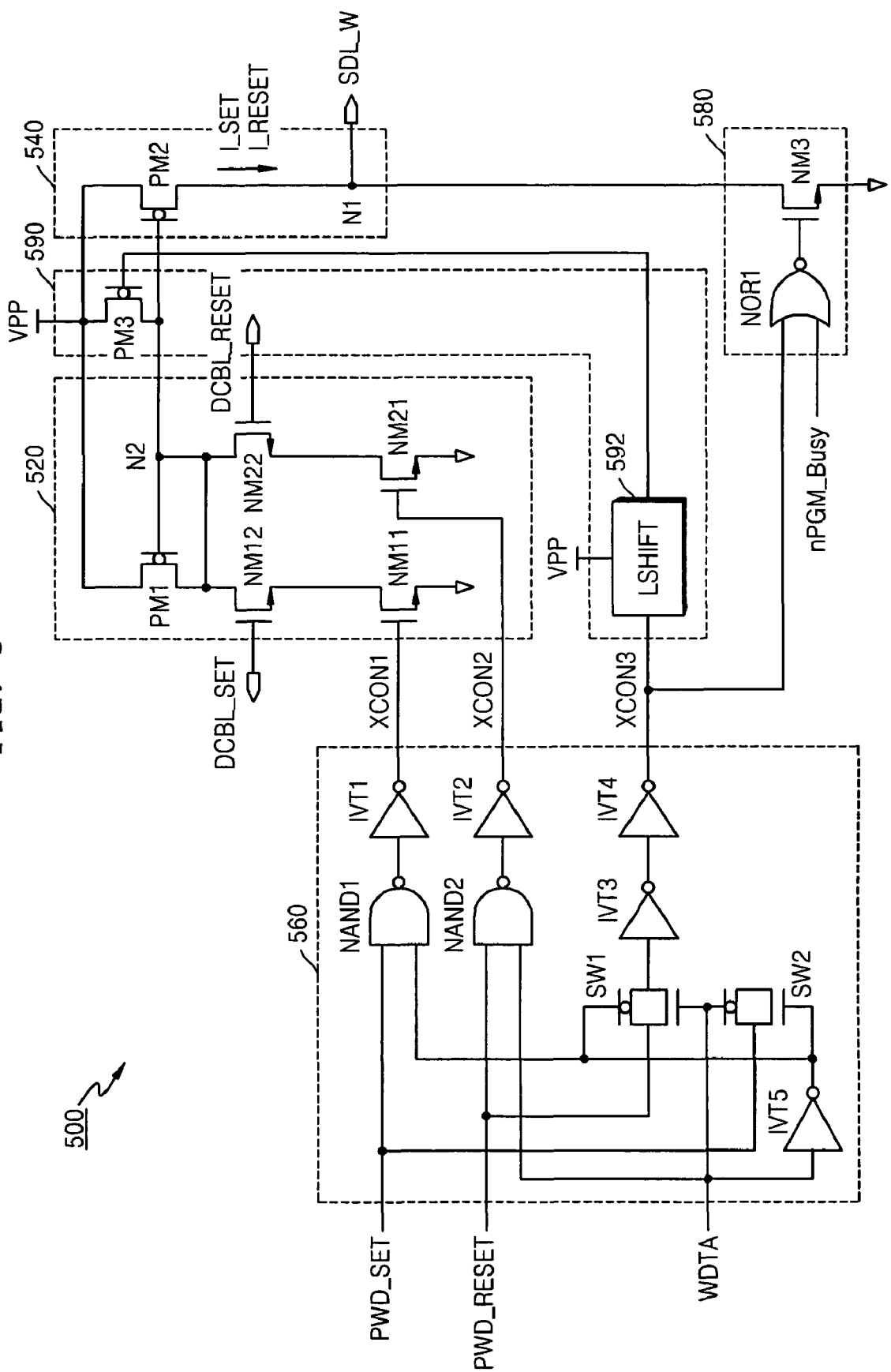
FIG. 6 illustrates a detailed circuit diagram of an example write driver circuit of FIG. 5.

FIG. 5 illustrates a block diagram of a write driver circuit 500 outputting a RESET current that is adjusted according to another embodiment. FIG. 6 illustrates a detailed circuit diagram of an example write driver circuit 500 of FIG. 5.

Referring to FIGS. 5 and 6, the write driver circuit 500 may be generally the same as the write driver circuit 300 of FIGS. 3 and 4, with the further inclusion of a gate voltage boosting unit 590. The write driver circuit 500 may use a boosted voltage VPP instead of the supply voltage VDD.

In the following description, features described above in connection with the write driver circuit 300 of FIGS. 3 and 4 may be similarly implemented in the write driver circuit 500 of FIGS. 5 and 6. For example, the write driver circuit 500 according to an embodiment may include a write current level adjusting unit 520, a write current output unit 540, and a control unit 560. The write current level adjusting unit 520 may include a SET current level adjusting unit 522, a RESET current level adjusting unit 524, and a transfer unit 526. The SET current level adjusting unit 522 may be enabled by the first control signal XCON1, and may determine first to n-th SET current levels LEV_SET corresponding to the SET state current level signal DCBL_SET. The RESET current level control unit 524 may be enabled by the second control signal XCON2, and may determine a RESET current level LEV_RESET corresponding to the RESET state current level signal DCBL_RESET. The write driver circuit 500 may further include a discharge unit 580.

The description below will detail the use of the boosted voltage VPP and operation of the gate voltage boosting unit 590.

In the write driver circuit 500, the boosted voltage VPP may be applied to one terminal of the driving transistor PM2 and the transfer transistor PM1, which may enable the write driver circuit 500 to more quickly generate the SET state current pulse I_SET and the RESET state current pulse I_RESET, as compared to the use of the supply voltage VDD.

The gate voltage boosting unit 590 may boost the voltage that is applied to a gate of the driving transistor PM2 and/or the transfer transistor PM1. For this, the gate voltage boosting unit 590 may include a boosting transistor PM3 and a level shifter LSHIFT 592.

The boosting transistor PM3 may be a PMOS transistor having one terminal to which the boosted voltage VPP is connected, and the other terminal connected to gates of a driving transistor PM2 and a transfer transistor PM1. The level shifter LSHIFT may control the gate of the boosting transistor PM3 in response to the third control signal XCON3. As described above, the third control signal XCON3 may be logic low "L" when both of the SET state pulse width control signal PWD_SET and the RESET state pulse width control signal PWD_RESET are not enabled. In this period, the gate voltage boosting unit 590 may boost gate voltages of the driving transistor PM2 and the transfer transistor PM1.

Figure 7:
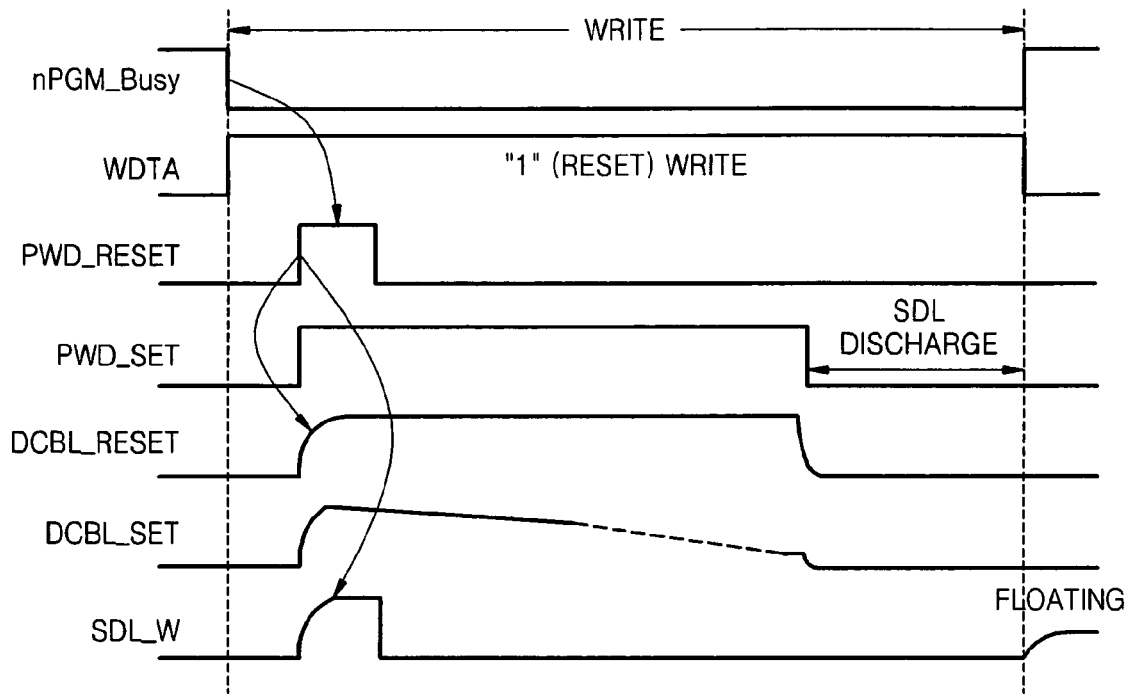
FIG. 7 illustrates a timing diagram of an operation of generating a RESET state current pulse in the write driver circuits of FIGS. 3 through 6.
Figure 8:
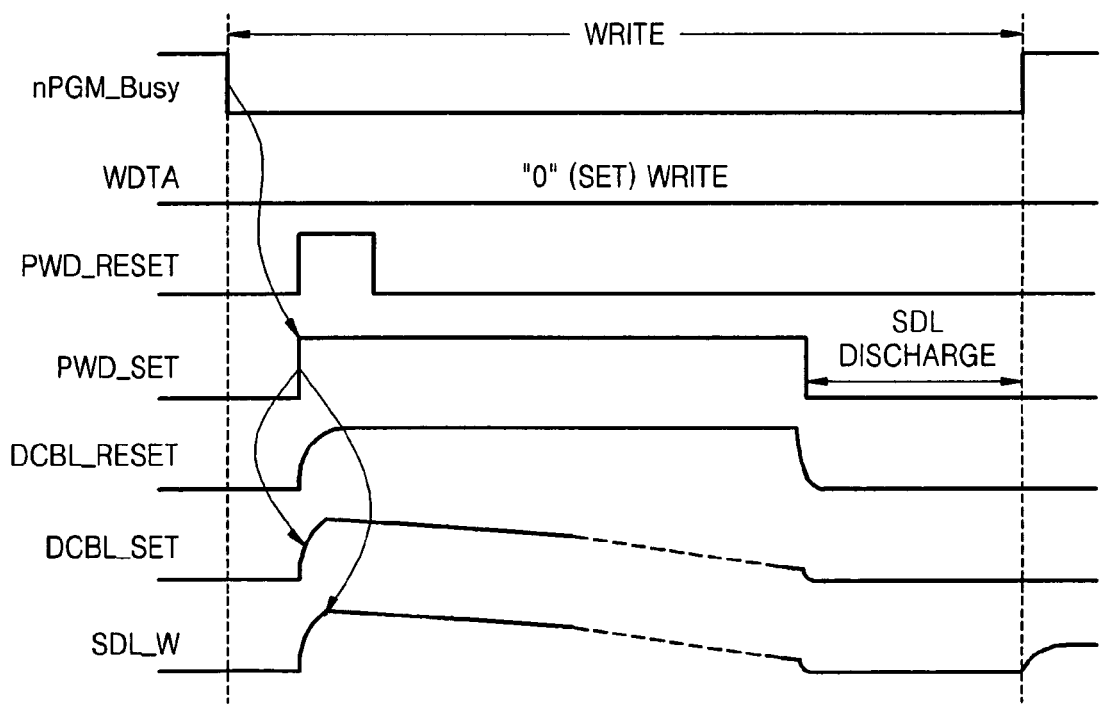
FIG. 8 illustrates a timing diagram of an operation of generating a SET state current pulse in the write driver circuits of FIGS. 3 through 6.

FIG. 7 illustrates a timing diagram of an operation of generating a RESET state current pulse in the write driver circuits of FIGS. 3 through 6. FIG. 8 illustrates a timing diagram of an operation of generating a SET state current pulse in the write driver circuits of FIGS. 3 through 6.

Referring to FIGS. 7 and 8, in a period in which the busy signal nPGM_Busy is logic low "L", the write driver circuit may perform a write operation. The write data "1" may be applied to generate the RESET pulse, and write data "0" may be applied to generate the SET pulse.

The RESET state pulse width control signal PWD_RESET and the SET state pulse width control signal PWD_SET may be simultaneously enabled and may have different widths. Further, the SET state current level signal DCBL_SET and the RESET state current level signal DCBL_RESET may be simultaneously applied.

The RESET state current level adjusting unit 324 shown in FIG. 4 may not operate when the write data is "0" (NM21 "off"), and the SET state current level adjusting unit 322 may not operate when the write data is "1" (NM11 "off"). Thus, as described above, the generated current depends on a value of the write data.

In a period in which the RESET state pulse width control signal PWD_RESET in FIG. 7 is enabled, the RESET state current pulse has a predetermined level corresponding to the RESET state current level signal DCBL_RESET, as shown in a waveform of "SDL_W" in FIG. 7. Similarly, in a period in which the SET state pulse width control signal PWD_SET in FIG. 8 is enabled, the SET state current pulse has a waveform having a gradually reduced level, which corresponds to the SET state current level signal DCBL_SET, as shown in a waveform of "SDL_W" in FIG. 8.

The word line discharge ("SDL Discharge") may be performed in a period in which both of the SET state pulse width control signal PWD_SET and the RESET state pulse width control signal PWD_RESET are not enabled and the busy signal nPGM_Busy is logic low "L", as described above.

Figure 9:
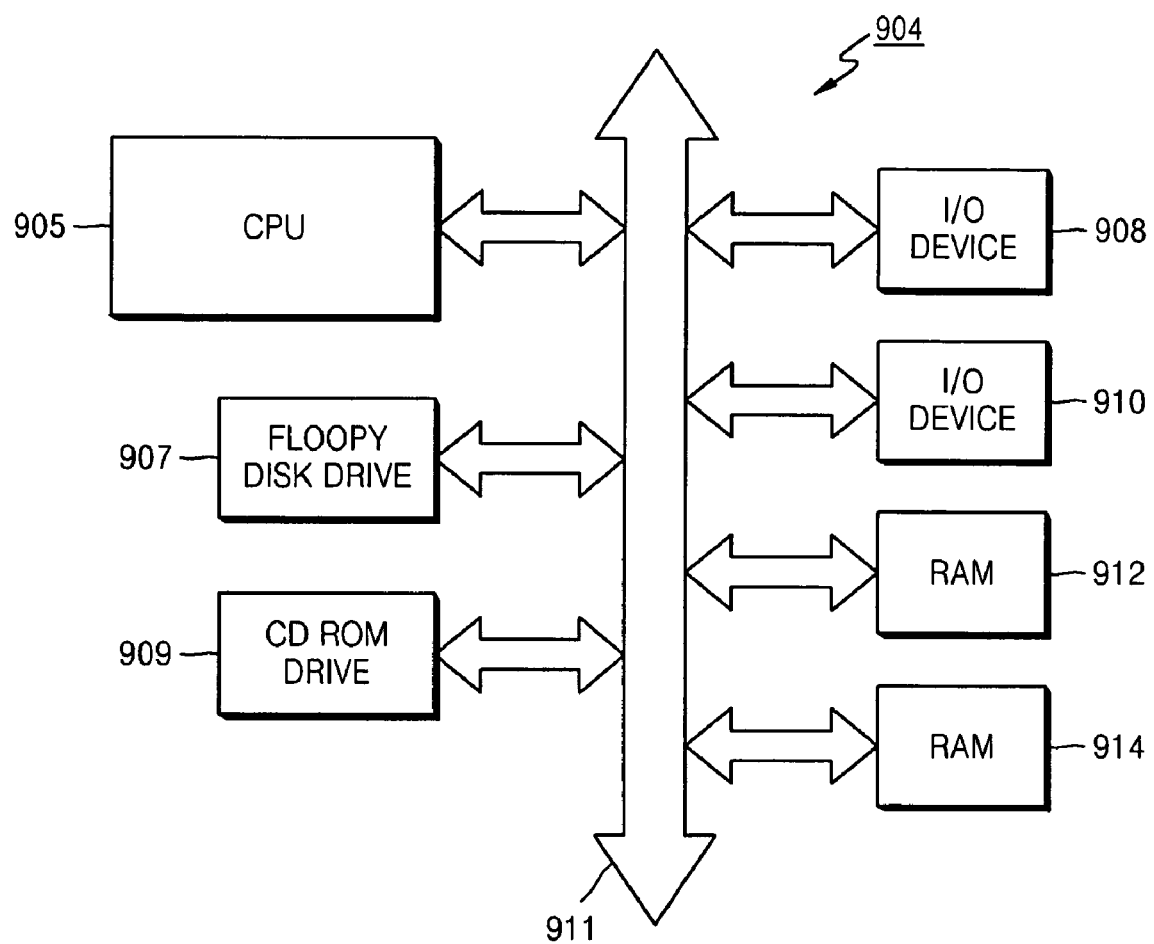
FIG. 9 illustrates a system including a PRAM memory according to an embodiment.

FIG. 9 illustrates a system 904 including a PRAM memory according to an embodiment. A PRAM memory according to an embodiment may be implemented as, e.g., a RAM 912. The system 904 may include a central processing unit (CPU) 905, e.g., a microprocessor, which communicates with the RAM 912 over a bus 911.

One or more input and/or output devices 908, 910, e.g., a keypad, a display, etc., may be coupled to bus 911. The system 904 may also include a read-only memory (ROM) 914, e.g., for storing boot instructions, firmware, etc. The ROM 914 may be an EEPROM. The ROM 914 may be a PRAM memory according to an embodiment. In some implementations, the system 904 may also provide for external storage media, e.g., hard drives, optical or magneto-optical drives, floppy disk drives, etc., such as compact disk (CD) ROM drive 909 and floppy disk drive 907.

As described above, a write driver circuit according to embodiments may adjust a level of RESET current. Further, the write driver circuit may reduce a layout area by outputting a SET current and a RESET current using a single driving transistor. The write driver circuit may also prevent a memory operation speed from being degraded by discharging a word line in a period of write operation in which the SET current and the RESET current are not generated. The write driver circuit configured to generate a SET current and a RESET using a boosted voltage, which may result in more reliable operation.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A write driver circuit for a memory that includes phase-change memory cells changeable between a RESET state resistance and a SET state resistance in response to an applied current pulse, the write driver circuit comprising:
a write current level adjusting unit configured to determine first to n-th SET state current levels in response to a SET state current level signal, where n is an integer greater than 1, and configured to determine a RESET state current level in response to a RESET state current level signal;
a write current output unit configured to generate one of a SET state current pulse and a RESET state current pulse corresponding to a SET state current level or a RESET state current level determined by the write current level adjusting unit, and
a discharge unit configured to discharge a word line of the memory, wherein:
the discharge unit receives a third control signal and a busy signal, and
the discharge unit discharges the word line in a write period in which the SET state current pulse and the RESET state current pulse are not generated, in response to the third control signal and the busy signal.

2. The write driver circuit as claimed in claim 1, wherein:
the first to n-th SET state current levels each have a minimum current level above a reference current level, and
the first to n-th SET state current levels are reduced over a duration of a write operation.

3. The write driver circuit as claimed in claim 2, wherein the reference current level maintains the phase-change memory cells at a crystallizing temperature at which a phase-change material in the phase-change memory cells begin to crystallize, the crystallizing temperature being lower than a melting temperature of the phase-change material.

4. The write driver circuit as claimed in claim 2, wherein the first SET state current level changes a phase-change memory cell requiring a highest current level for the SET state resistance among the phase-change memory cells, into the SET state resistance.

5. The write driver circuit as claimed in claim 2, wherein the first SET state current level does not exceed a level of current that would heat the phase-change memory cells to their melting temperature.

6. The write driver circuit as claimed in claim 1, wherein:
the write current output unit includes a drive transistor,
one terminal of the drive transistor is connected to a supply voltage,
another terminal of the drive transistor is connected to a word line of the semiconductor memory, and
a gate of the drive transistor receives a second node voltage corresponding to a supply voltage.

7. The write driver circuit as claimed in claim 1, wherein the write current level adjusting unit includes:
a SET state current level adjusting unit enabled by a first control signal for determining first to n-th SET state current levels corresponding to the SET state current level signal;
a RESET state current level adjusting unit enabled by a second control signal for determining a RESET state current level corresponding to the RESET state current level signal; and
a transfer unit configured to transfer the first to n-th SET state current levels and the RESET state current level to the write current output unit.

8. The write driver circuit as claimed in claim 7, wherein the SET state current level adjusting unit includes:
an 11th transistor turned on by the first control signal; and
a 12th transistor having one terminal receiving a second node voltage corresponding to a supply voltage, having another terminal connected to the 11th transistor, and having a gate receiving the SET state current level signal.

9. The write driver circuit as claimed in claim 7, wherein the RESET state current level adjusting unit includes:
a 21st transistor controlled by the second control signal; and
a 22nd transistor having one terminal receiving a second node voltage corresponding to a supply voltage, having another terminal connected to the 21st transistor, and having a gate receiving the RESET state current level signal.

10. The write driver circuit as claimed in claim 7, further comprising a control unit that includes:
a first control signal generating unit configured to output the first control signal in response to a SET state current width control signal and a first write data value; and
a second control signal generating unit configured to output the second control signal in response to a RESET state current width control signal and a second write data value.

11. The write driver circuit as claimed in claim 7, wherein:
the transfer unit includes a transfer transistor,
the transfer transistor has a gate and one terminal each receiving a second node voltage corresponding to a supply voltage,
the transfer transistor includes another terminal receiving the supply voltage, and
the terminal of the transfer transistor that receives the second node voltage is connected to the SET state current level adjusting unit and the RESET state current level adjusting unit.

12. The write driver circuit as claimed in claim 1, further comprising a control unit configured to output the third control signal in response to a SET state current width control signal, a RESET state current width control signal, and a write data value.

13. The write driver circuit as claimed in claim 1, wherein the discharge unit includes:
a NOR unit configured to perform a NOR operation on the third control signal and the busy signal; and
a discharge transistor gated by an output of the NOR unit and disposed between a ground voltage and the word line.

14. The write driver circuit as claimed in claim 1, wherein the write current output unit is configured to output the SET state current pulse and the RESET state current pulse using a boosted voltage, the boosted voltage being higher than a supply voltage.

15. The write driver circuit as claimed in claim 14, wherein:
the write current output unit includes a drive transistor,
the drive transistor has a terminal connected to the boosted voltage,
the drive transistor has another terminal connected to a word line of the memory, and
the drive transistor includes a gate receiving a second node voltage corresponding to the boosted voltage.

16. The write driver circuit as claimed in claim 15, further comprising a gate voltage boosting unit configured to boost a gate voltage of the drive transistor.

17. The write driver circuit as claimed in claim 16, wherein the gate voltage boosting unit includes:
a boosting transistor disposed between a source of the boosted voltage and the gate of the drive transistor; and
a level shifter boosting a third control signal to correspond to the boosted voltage and configured to apply the third control signal to a gate of the boosting transistor, the third control signal being enabled in a write period in which the SET state current pulse and the RESET state current pulse are not generated.

18. The write driver circuit as claimed in claim 14, wherein the write current level adjusting unit determines the first to n-th SET state current levels and the RESET state current level using the boosted voltage.

19. The write driver circuit as claimed in claim 1, wherein:
the write current level adjusting unit is configured to adjust the level of the RESET state current, and
the write current output unit includes a driving transistor that outputs both the SET state current pulse and the RESET state current pulse.

\* \* \* \* \*